United States Patent [19]

Hasegawa

[11] 3,968,270

[45] July 6, 1976

[54] PROCESS FOR PREPARATION OF METAL COATINGS

[76] Inventor: Takashi Hasegawa, 4-23-15, Nakabara, Isogo, Yokohama, Japan

[22] Filed: Sept. 19, 1974

[21] Appl. No.: 507,490

[30] Foreign Application Priority Data
Nov. 6, 1973  Japan..............................48-125084
Nov. 6, 1973  Japan..............................48-125085

[52] U.S. Cl.................................. 427/13; 204/164; 427/40
[51] Int. Cl.².......................................... B05D 1/06
[58] Field of Search.......... 117/93.1 GD, 93.4, 93.3, 117/93, 106 R, 107, 71 M, 72, 75; 204/164; 427/40, 13

[56] References Cited
UNITED STATES PATENTS

| | | | |
|---|---|---|---|
| 2,686,654 | 8/1954 | Roush | 117/71 M |
| 3,290,567 | 12/1966 | Gowen | 117/93.3 |
| 3,562,141 | 2/1971 | Morley | 117/93 |
| 3,639,151 | 2/1972 | Krutenat | 117/93.1 GD |
| 3,677,796 | 7/1972 | Girard et al. | 117/71 M |

*Primary Examiner*—John H. Newsome
*Attorney, Agent, or Firm*—Haseltine, Lake & Waters

[57] ABSTRACT

A metal electrodeposition process that can provide an anti-corrosive and protective metal coating tightly bonded on the surface of a substrate is disclosed, said process comprising positively charging a metal vapor in steam or an inert gas maintained at a low pressure and electrically depositing the metal on the surface of a substrate which is negatively charged. When the so formed metal coating is impregnated with an organic silicon compound such as ethyl silicate and is subjected to a high temperature treatment, the metal coating is stabilized and the corrosion resistance of the metal coating is further improved.

12 Claims, No Drawings

PROCESS FOR PREPARATION OF METAL COATINGS

BACKGROUND OF THE INVENTION

1. Field of the Invention

This invention relates to a process for preparing an elaborate anti-corrosive and protective coating of a metal such as titanium bonded tightly on the surface of a substrate such as metals, metal oxides and plastics according to the electrodeposition method using low pressure steam or inert gas as an electrodeposition atmosphere.

2. Description of the Prior Art

Protective coatings of metals, especially titanium, are industrially very useful because they are ductile and are excellent in the corrosion resistance and heat resistance. However, it has heretofore been impossible to prepare coatings of metals such as titanium on an industrial scale by chemical or electrochemical plating methods.

As the physical means for forming metal coatings, there can be mentioned a vacuum evaporation coating method. According to this method, it is possible to form a very thin filmy coating, but the resulting coating is very poor in adherence to the substrate and it is readily wiped away by fingers. According to the sputtering method, which is included in the category of the vacuum evaporation coating method, it is possible to obtain a metal coating having an improved adherence to the substrate, but the coating is so weak that it cannot be used as a protective coating. Further, since the evaporation deposition rate is very low in this sputtering method, this method is of no industrial utility when it is desired to obtain coatings of a sufficient thickness.

SUMMARY OF THE INVENTION

It is therefore a primary object of this invention to provide a process for preparing coatings of metals such as titanium, according to which the foregoing defects involved in the conventional methods can be overcome and elaborate metal coatings excellent in the adherence to the substrate and in the corrosion resistance and heat resistance can be prepared at a very high electrodeposition rate.

As a result of our research works made on the metal electrodeposition methods, it has been found that when a vapor of a metal such as titanium is positively charged in a low pressure steam or inert gas atmosphere while negatively charging the surface of a substrate, an elaborate and strong coating of a sufficient thickness can be obtained at such a high electrodeposition rate as will allow industrialization of this process and the resulting coating is very excellent in the adherence to the substrate and the corrosion resistance and heat resistance. Based on this finding, we have now completed this invention.

More specifically, in accordance with one aspect of this invention, there is provided a process for the preparation of metal coatings which comprises positively charging a metal vapor in steam or an inert gas maintained at a low pressure and electrically depositing the metal on the surface of a substrate which is negatively charged.

It has also been found that when the so prepared metal coating is impregnated with an organic silicon compound such as ethyl silicate and is then subjected to a high temperature treatment, a high pore-sealing effect can be attained, and the metal coating is highly stabilized and its corrosion resistance is further improved.

Therefore, in accordance with another aspect of this invention, there is provided a process for the preparation of metal coatings having highly improved corrosion resistance which comprises positively charging a metal vapor in steam or an inert gas maintained at a low pressure, electrically depositing the metal on the surface of a substrate which is negatively charged, impregnating the resulting metal coating with an organic silicon compound, and subjecting the impregnated metal coating to a high temperature treatment.

DESCRIPTION OF THE PREFERRED EMBODIMENTS

In this invention, steam or an inert gas such as argon and nitrogen is introduced in vacuum and the pressure of such gas is adjusted to $10^{-2}$ to $10^{-4}$ mm Hg. In this low pressure steam or inert gas atmosphere, a metal such as titanium is positively charged and a substrate is negatively charged, whereby the metal vapor is focused in the negative direction and accelerated to impinge on the negatively charged substrate and form a coating thereon.

Charging of a vapor of a metal such as titanium is accomplished in the following manner. When discharge is caused in a low pressure steam or inert gas atmosphere, molecules of water or monoatomic molecules of argon or nitrogen are ionized, and these ionized molecules impinge on a vapor of a metal such as titanium to form an ionized metal vapor or electrons impinge directly on a metal vapor to ionize it.

The ionizing energy contributing to attainment of such plasma state is 12.7 eV in the case of the water molecule and 15.75 eV in the case of the monoatomic molecule of argon. Accordingly, the ionizing effect of steam is higher than that of an inert gas such as argon. Further, the radius of the water molecule is larger than the ion radius of argon (1.91 A) and is hardly decomposable. In view of the foregoing, it is expected that water is less occluded in the resulting metal coating than argon or the like and that use of steam results in electrodeposition of a metal coating of a less porous and finer structure than use of an inert gas such as argon and nitrogen. In fact, according to our experiments, it has confirmed that an elaborate and hard metal coating having better properties can be obtained by the electrodeposition using steam. Therefore, in this invention, it is preferred that steam is used as an electrodeposition atmosphere.

The kind of the substrate on which a metal such as titanium is electrically deposited is not particularly critical in this invention, and any of substrates used in this field, such as mild steel, stainless steel, brass, aluminum, alumite, ABS plastics and the like, can be used in this invention.

In this invention, in order to perform discharge effectively, it is possible to adopt such auxiliary means as application of a high frequency electric field for agitating electrons or charged particles and application of an electromagnetic field for focusing electrons or charged particles.

Also the kind of the metal to be electrically deposited on the surface of the substrate is not particularly critical in this invention, and any of such metals as titanium, gold, silver, chromium and the like can be used in this invention and a suitable metal is chosen depending on the intended use of the coated product. However, in view of physical and chemical properties of the metal coating, use of titanium is especially preferred.

As pointed above, when the so prepared metal coating is impregnated with an organic silicon compound and the impregnated metal coating is subjected to a high temperature treatment, the stability and corrosion resistance of the coating can be further improved.

It is possible to improve the stability and corrosion resistance of a metal coating formed by the above-mentioned electrodeposition process using a low pressure steam or inert gas atmosphere, by heat-treating it at such a high temperature as about 800°C. for several hours. However, in this case, a large quantity of heat is given to the coating and bad influences are generally given to the substrate if such large quantity of heat is given. Further, from the economical viewpoint, it is not preferred that the heat treatment is conducted at such a high temperature as about 800°C. for a long time, e.g., several hours.

It has been found that if the above metal coating is impregnated with an organic silicon compound such as ethyl silicate and the impregnated coating is heated in air or an inert gas, the organic silicon compound is decomposed to precipitate silicon dioxide in pores or voids in the metal coating and the pore-sealing effect can be attained.

Various organic silicon compounds can be used in this invention, but in view of the price, the easiness in handling and the non-toxicity use of ethyl silicate is especially preferred. Ethyl silicate is excellent in the property of permeating into the metal coating, and as a result of the thermal differential analysis, it has been confirmed that the thermal decomposition point is about 425°C. Therefore, in the case of ethyl silicate, the intended pore-sealing effect can be attained at a relatively low temperature for a short time, and hence, no bad influences are given to the substrate by the heat treatment conducted after the impregnation treatment. As is well known in the art, the corrosion resistance of silicon dioxide precipitated in pores is very high and it does not give bad influences on the substrate by the thermal reaction with titanium or other metal.

The temperature adopted for this heat treatment is not particularly critical, as far as it is higher than the thermal decomposition point of the organic silicon compound impregnated into the metal coating.

The coating of a metal such as titanium obtained according to this preferred embodiment is tightly bonded to the substrate and it exhibits satisfactory results at a dipping test in a 10% aqueous solution of sodium chloride or a saturated aqueous solution of caustic soda. Accordingly, the coating can be effectively used as an anti-corrosive protective coating in various fields.

As is apparent from the foregoing illustration, according to the process of this invention a metal such as titanium is sufficiently intruded into minute scars or pores of a substrate and forms thereon an elaborate tough coating bonded tightly to the surface of the substrate. Furthermore, a sufficiently high electrodeposition rate can be attained in the process of this invention, and hence, the process can be practised on an industrial scale and metal coatings having excellent properties can be provided with great economical advantages. Accordingly, it is expected that the process of this invention can be industrially applied in various fields.

This invention will now be illustrated in more detail by reference to the following Examples that by no means limit the scope of this invention.

EXAMPLE 1

Steam was introduced in vacuum and the steam pressure was adjusted to $5 \times 10^{-4}$ mm Hg. In this atmosphere, mild steel, stainless steel, brass, aluminum, alumite (also spelled as alunite, a naturally occurring basic potassium aluminum sulfate, usually found with vulcanic and other igneous rocks) and ABS plastic plates were placed as substrates, and a direct current voltage of $-1000$ V was applied to these substrates. Separately, a titanium evaporation source was placed in the above low pressure steam atmosphere and connected to an electric source of a direct current of 0 V. A high frequency electric field of 13.6 MC was applied between this titanium evaporation source and a ring-like high frequency electrode to accelerate discharge. Then, the titanium evaporation source was heated to evaporate spongy titanium. On each of the foregoing substrates, a titanium coating could be obtained. In each case, the electrodeposition rate was such that a coating of a thickness of about 3 $\mu$ was obtained in an electrodeposition time of 5 minutes.

Each of the so formed titanium coatings was not peeled from the substrate even if it was rubbed with a knife or the like. Further, when flexible samples among the so formed samples were subjected to the repeated bending test under conditions of a bending radius of 5 mm and a bending angle of 90°, it was found that even if the test was repeated more than 10 times, no crack nor peeling was caused. Moreover, when these samples were subjected to the exposure test in the open air, such troubles as discoloration and peeling was not caused to occur in each sample. In a sample prepared by employing mild steel as the substrate, rusting was observed in the substrate at the exposure test but the degree of rusting was very low and could be neglected.

When the above procedures were repeated by employing argon gas instead of steam, excellent titanium coatings were similarly obtained. When a sample prepared by employing mild steel as a substrate was subjected to the open air exposure test, it was found that rusting was observed and the period from the start of the exposure test to appearance of rusts was shortened to about one-half to one-third of the period observed in the case of the sample prepared by employing steam as an electrodeposition atmosphere. Thus, it was confirmed that steam is preferable to an inert gas such as argon.

When the electrodeposition was repeated under the same conditions by employing gold, silver and chromium instead of titanium, in each case an elaborate and hard coating was obtained and each metal coating was bonded tightly to the substrate. It was found that in each case the electrodeposition rate was as high as attained in the case of titanium.

EXAMPLE 2

Steam was introduced in vacuum and the steam pressure was adjusted to $2 \times 10^{-3}$ mm Hg. In this low pressure steam atmosphere, mild steel, stainless steel, brass, aluminum and alumite (also spelled as alunite, a naturally occurring basic potassium aluminum sulfate, usually found with vulcanic and other igneous rocks) were placed as substrates and a direct current of $-800$ V was applied to these substrates. Separately, a titanium evaporation source was placed in this low pressure steam atmosphere and connected to an electric source of a direct current of 0 V. A high frequency electric field of 13.6 MC was applied between this titanium evaporation source and a ring-like high frequency electrode to accelerate discharge. Then, the titanium evaporation source was heated to evaporate spongy titanium and electrically deposit titanium on the above substrates. (The so obtained titanium-coated substrates are designated as "samples of group A".)

Under the same conditions as above, the electrodeposition was conducted in argon gas maintained at a reduced pressure of $2 \times 10^{-3}$ mm Hg. (The so obtained titanium-coated substrates are designated as "samples of group B".)

Among these samples of the groups A and B, those prepared by employing mild steel and stainless steel as substrates were subjected to a high temperature treatment at 800°C for 3 hours.

Separately, each of samples of the groups A and B was impregnated with ethyl silicate and then, it was heat-treated in air at 500°C for 10 minutes.

All of the foregoing samples were subjected to a dipping test in a 10% aqueous solution of sodium chloride to obtain the following results:

Samples of Group A

Rusting was caused in the sample prepared by mild steel as the substrate when the dipping was continued for about 10 to about 15 hours.

Samples of Group B

Rusting was caused to occur in the sample prepared by employing mild steel as the substrate and a part of the coating was peeled from the substrate when the dipping was continued for about 5 to about 6 hours.

High Temperature-Treated Samples of Groups A and B

No change was observed even after the dipping test had been continued for 500 hours.

Ethyl Silicate-Impregnated and Heat-Treated Samples of Groups A and B

No change was observed even after the dipping test had been continued for 500 hours.

From the foregoing results, it will readily be understood that protective coatings having a highly improved corrosion resistance can be obtained according to the preferred embodiment of this invention in which ethyl silicate is impregnated into the metal coating prior to the heat treatment, and that according to this preferred embodiment the temperature for the heat treatment can be lowered and the heat treatment time can be greatly shortened.

When metals other than titanium, such as gold, silver and chromium, were electrically deposited on mild steel substrates in the same manner as above in low pressure steam and argon atmospheres according to the preferred embodiment of this invention using ethyl silicate and the resulting metal coatings were subjected to the dipping test in a 10% aqueous solution of sodium chloride, good results were obtained as in the above samples prepared by using titanium. Thus, it was confirmed that an excellent pore-sealing effect can be attained in this invention in the case of not only titanium but also other metals such as gold, silver and chromium.

What is claimed is:

1. A process for the preparation of metal coatings which comprises positively charging a metal vapor in steam or an inert gas maintained at a low pressure and electrically depositing the metal in an electrodeposition atmosphere which is low pressure steam on the surface of a substrate which is negatively charged.

2. A process according to claim 1 wherein the metal vapor is titanium vapor.

3. A process according to claim 1 wherein the electrodeposition atmosphere is maintained at a pressure of $10^{-2}$ mm Hg to $10^{-4}$ mm Hg.

4. A process according to claim 1 wherein a high frequency electric field is applied to the electrodeposition atmosphere.

5. A process according to claim 1 wherein an electromagnetic field is applied to the electrodeposition atmosphere.

6. A process for the preparation of metal coatings having highly improved corrosion resistance which comprises positively charging a metal vapor in steam maintained at a low pressure, electrically depositing the metal on the substrate which is negatively charged to form a porous metal coating, impregnating the resulting metal coating with an organic silicon compound, and subjecting the impregnated metal coating to a temperature treatment higher than the thermal decomposition point of the organic silicon compound impregnated into the metal coating.

7. A process according to claim 6 wherein the metal vapor is titanium vapor.

8. A process according to claim 6 wherein the organic silicon compound is ethyl silicate.

9. A process according to claim 6 wherein the electrodeposition atmosphere is maintained at a pressure of $10^{-2}$ mm Hg to $10^{-4}$ mm Hg.

10. A process according to claim 6 wherein a high frequency electric field is applied to the electrodeposition atmosphere.

11. A process according to claim 6 wherein an electromagnetic field is applied to the electrodeposition atmosphere.

12. A process according to claim 6 wherein the high temperature treatment is conducted in air or an inert gas.

* * * * *